United States Patent
Ye et al.

(10) Patent No.: US 9,752,224 B2
(45) Date of Patent: Sep. 5, 2017

(54) STRUCTURE FOR RELAXED SIGE BUFFERS INCLUDING METHOD AND APPARATUS FOR FORMING

(71) Applicant: Applied Materials, Inc., Santa Clara, CA (US)

(72) Inventors: Zhiyuan Ye, San Jose, CA (US); Errol Antonio C. Sanchez, Tracy, CA (US); Keun-Yong Ban, Santa Clara, CA (US); Xinyu Bao, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/210,030

(22) Filed: Jul. 14, 2016

(65) Prior Publication Data
US 2017/0040421 A1 Feb. 9, 2017

Related U.S. Application Data

(60) Provisional application No. 62/201,153, filed on Aug. 5, 2015.

(51) Int. Cl.
*H01L 21/02* (2006.01)
*C23C 8/02* (2006.01)

(52) U.S. Cl.
CPC ............ *C23C 8/02* (2013.01); *H01L 21/0262* (2013.01); *H01L 21/02381* (2013.01); *H01L 21/02461* (2013.01); *H01L 21/02463* (2013.01); *H01L 21/02532* (2013.01); *H01L 21/0245* (2013.01); *H01L 21/02502* (2013.01)

(58) Field of Classification Search
CPC ............ H01L 29/267; H01L 21/02543; H01L 21/02546

USPC .................................................. 257/190, 19
See application file for complete search history.

(56) References Cited

U.S. PATENT DOCUMENTS

| 8,063,397 B2 * | 11/2011 | Mori ..................... H01L 33/30 257/18 |
| 9,178,095 B2 * | 11/2015 | Hennessy ............... H01L 31/05 |
| 2008/0149915 A1 | 6/2008 | Mori et al. |

(Continued)

OTHER PUBLICATIONS

International Search Report and Written Opinion dated Oct. 20, 2016 for Application No. PCT/US2016/042422.

*Primary Examiner* — Tan N Tran
(74) *Attorney, Agent, or Firm* — Patterson + Sheridan LLP

(57) ABSTRACT

Embodiments of the present disclosures provide methods and apparatus for manufacturing semiconductor devices such as transistors used for amplifying or switching electronic signals. Specifically, embodiments of the present disclosure generally relate to a semiconductor device having a film stack including an interlayer of semiconductor material and a buffer layer of semiconductor material underneath an active device layer. In various embodiments, the interlayer may include group III-V semiconductor materials formed between a first surface of a silicon-based substrate and the buffer layer. In certain embodiments the buffer layer may comprise group IV semiconductor materials. The interlayer may have a lattice constant designed to mitigate lattice mismatch between the group IV buffer layer and the silicon-based substrate. The buffer layer may provide improved integration of the active device layer to improve the performance of the resulting device.

14 Claims, 2 Drawing Sheets

(56) References Cited

U.S. PATENT DOCUMENTS

| | | | |
|---|---|---|---|
| 2011/0132445 A1* | 6/2011 | Pitera | H01L 31/0687 |
| | | | 136/255 |
| 2011/0263098 A1 | 10/2011 | Su | |
| 2013/0112275 A1 | 5/2013 | Hekmatshoar-Tabari et al. | |
| 2015/0079803 A1 | 3/2015 | Huang et al. | |
| 2015/0194338 A1* | 7/2015 | Di | H01L 21/76254 |
| | | | 438/458 |

* cited by examiner

STRUCTURE FOR RELAXED SIGE BUFFERS INCLUDING METHOD AND APPARATUS FOR FORMING

CROSS-REFERENCE TO RELATED APPLICATIONS

This application claims benefit to U.S. Provisional Patent Application No. 62/201,153, filed Aug. 5, 2015, the entirety of which is hereby incorporated by reference.

FIELD

Embodiments of the present disclosure generally relate to semiconductor devices. More particularly, embodiments of the present disclosure relate to a film stack including layers of group III-V and group IV semiconductor materials.

BACKGROUND

Group III-V semiconductor materials have been used in various electronic, optical, and optoelectronic devices. Examples of such devices may include metal-oxide-semiconductor field-effect transistors (MOSFETs), light emitting diodes (LEDs), laser diodes (LDs), etc. Group III-V semiconductor materials (i.e., a combination of at least one Group III material and at least one Group V material) may be fabricated by depositing, or growing, a stack of films of group III-V semiconductor materials on an underlying substrate, such as a silicon substrate. The stack of films may form active layers having certain electrical or optical properties via strain or gap engineering.

However, direct growth of certain group III-V layers on a silicon substrate has been problematic due to heteroepitaxial issues such as lattice mismatch, thermal expansion mismatch, and differences in interfacial surface energy between group III-V layers and the silicon substrate, which create dislocations that may propagate through the structure and degrade the device performance.

Additionally, silicon germanium strain relaxed buffers (SRBs) may be formed on active layers to provide a foundation. Active layers, such as channel layers, in transistor devices historically have been grown on silicon substrates. SRBs formed by existing methods on silicon substrates have defect densities greater than 10,000 cm$^{-2}$ which cause defective channel layers to be grown thereon. Additionally, as dimensions have decreased, the need has been realized to provide SRB layers that provide a decrease in defect density and/or better absorb causes of defects.

Therefore, there is a need in the art for a method and apparatus for forming relaxed silicon germanium buffer layers on a substrate with improved quality and performance for advanced CMOS devices.

SUMMARY

Embodiments of the disclosure relate to a film stack including layers of group III-V and group IV semiconductor materials. In various embodiments, a semiconductor device is provided. The device may include a semiconductor substrate having a first surface, a group III-V interlayer formed on the first surface, and a group IV buffer layer formed on the interlayer. The group III-V interlayer may include a GaAsP material or an InGaP material. The group IV buffer layer may include silicon and germanium formed on the interlayer. Additionally, the concentration of arsenic or indium in the group III-V interlayer may be directly related to the concentration of germanium in the buffer layer.

In another embodiment, a processing system for processing a substrate is disclosed. The processing system may include a transfer chamber, a group III-V epitaxy chamber operatively connected to the transfer chamber, and a group IV epitaxy chamber operatively connected to the transfer chamber.

In yet another embodiment, a method for forming a semiconductor device is disclosed. The method may include forming a first semiconductor layer over a surface of a substrate and forming a second semiconductor layer over the first semiconductor layer. The first semiconductor layer may include a GaAsP material or an InGaP material. The second semiconductor layer may include a SiGe material. The first semiconductor layer and the second semiconductor layer may be formed at a process temperature of less than about 650° C.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 2:
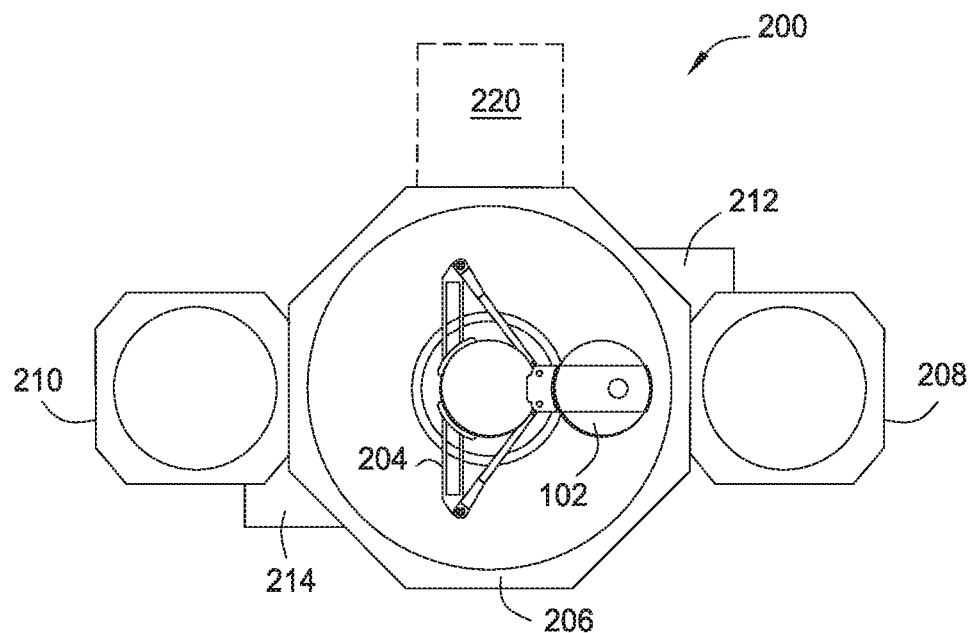
FIG. 2 schematically illustrates a processing system according to one embodiment described herein.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosures provide methods and apparatus for manufacturing semiconductor devices such as transistors used for amplifying or switching electronic signals. For example, the methods may be utilized in the manufacture of CMOS (Complementary Metal-Oxide-Semiconductor) transistors. Embodiments of the present disclosure generally relate to a semiconductor device having a film stack including an interlayer of semiconductor material and a buffer layer of semiconductor material underneath an active device layer. In various embodiments, the interlayer may include group III-V semiconductor materials formed between a first surface of a silicon-based substrate and the buffer layer. In certain embodiments the buffer layer may comprise group IV semiconductor materials. The interlayer may have a lattice constant designed to mitigate lattice mismatch between the group IV buffer layer and the silicon-based substrate. The buffer layer may provide improved integration of the active device layer onto the silicon-based substrate, thus improving the performance of the resulting device. Various embodiments of the present disclosure are discussed in more detail below.

The term "substrate" used herein is intended to broadly cover any object that can be processed in a process chamber. The substrate 102 may be any substrate capable of having material deposited thereon, such as a silicon substrate, for example silicon (doped or undoped), crystalline silicon (e.g., Si <100> or Si <111>), strained silicon, germanium, a group III-V compound substrate, a silicon germanium (SiGe) substrate, a substrate having an epitaxial layer grown thereon, a silicon-on-insulator (SOI) substrate, a patterned or non-patterned semiconductor wafer, or any other materials such as metals, metal alloys, and other conductive materials. In one embodiment, the substrate 102 is a silicon-based substrate, such as a silicon substrate.

Figure 1:
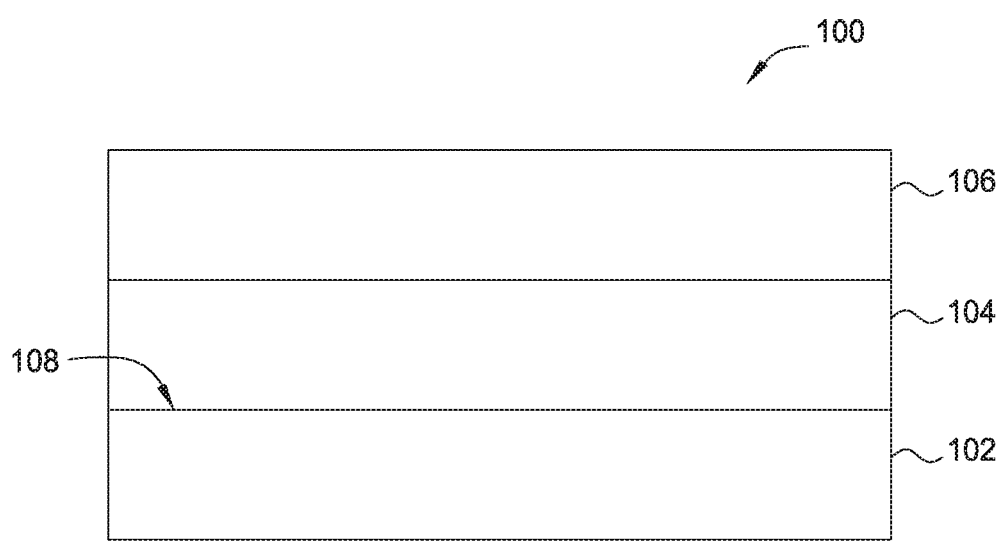
FIG. 1 schematically illustrates a film stack according to one embodiment described herein.

FIG. 1 schematically illustrates a film stack 100 according to one embodiment of the present disclosure. The film stack 100 may be a portion of a MOSFET structure. The film stack 100 may include an interlayer 104 deposited on a substrate 102. The film stack 100 may also include a buffer layer 106 deposited on the interlayer 104.

The interlayer 104 may be formed on a first surface 108 of the substrate 102. In one embodiment, the interlayer 104 may be a group III-V semiconductor material. The group III-V material may be a binary, ternary, and quaternary alloys thereof and compounds with higher number of elements from Group III and V. In one embodiment, the group III-V material is a gallium containing layer, such as GaAsP. In another embodiment, the group III-V material is an indium containing layer, such as InGaP. The group III-V material may be stoichiometric or non-stoichiometric. For example, a GaAsP layer may be characterized by the formula $GaAs_xP_y$, where $x+y=1$ for a stoichiometric material and $x+y \neq 1$ for a non-stoichiometric material. Likewise, InGaP may be $In_xGa_yP$, where $x+y=1$ for a stoichiometric material and $x+y \neq 1$ for a non-stoichiometric material. The interlayer 104 may have a thickness of between about 1 nm and about 500 nm, for example between about 2 nm and about 400 nm. The use of a GaAsP or InGaP may be advantageous because it can be lattice-matched to SiGe, i.e., x and y chosen to achieve the lattice size of the buffer layer 106 comprising relaxed SiGe of a specific percent germanium concentration. The lattice size of stoichiometric $GaAs_xP_y$ ($x+y=1$) varies approximately linearly between GaAs (5.65325 Å) and GaP (5.4505 Å) as x and y vary from 0 to 1. Likewise, the lattice size of stoichiometric $In_xGa_yP$ varies approximately linearly between InP (5.8687 Å) and GaP as x and y vary from 0 to 1. The lattice size of $Si_xGe_y$ varies approximately linearly between the lattice size of Si (5.431 Å) and Ge (5.658 Å) as x and y vary. Thus, lattice size of the interlayer 104 may be selected to match that of a desired SiGe composition by adjusting the elemental composition of the interlayer 104, which may serve as a nucleation layer or a transition layer for subsequent layers.

In various embodiments, the interlayer 104 is in direct contact with the substrate 102. The interlayer 104 may have a lattice constant and a crystal orientation closely matched (i.e., lattice mismatch less than 5%) to the underlying substrate 102, or alternatively, upon rotation of one crystal orientation with respect to the other crystal orientation, a substantial match in lattice constants is achieved, to avoid or minimize strain (due to lattice mismatch) in the crystal lattice of the subsequent layers to be formed on the interlayer 104. In this disclosure, the term "substantially matched" means that there is sufficient similarity between the lattice constants to permit the growth of a high quality crystalline layer on the underlying layer. Therefore, the interlayer 104 may serve to accommodate a lattice mismatch between the buffer layer 106 and the substrate 102, as disclosed herein.

While the interlayer 104 is shown as a single layer, the interlayer 104 may alternatively be a stack of layers of semiconductor material. For example, the interlayer 104 may include one or more layers containing group III-V materials. As used in this disclosure, the term "III-V compounds" refers to the compounds formed by chemical elements from Group III and Group V from the periodic table of elements and can include binary, ternary, and quaternary alloys thereof and compounds with higher number of elements from Group III and V.

The interlayer 104 may be part of any suitable semiconductor device, such as transistors used for amplifying or switching electronic signals, an optical device, any integrated circuit such as bipolar, N-type or P-type metal oxide semiconductor (NMOS or PMOS), or CMOS, etc. In one embodiment, the interlayer 104 is underneath a channel layer of a CMOS device. In another embodiment, the interlayer 104 includes a plurality of alternating group III-V semiconductor layers, such as GaAsP and InGaP layers, which form a multiple layer structure. In yet another embodiment, the interlayer 104 may be an absorption layer of an optical device. In one embodiment, the interlayer 104 may be a layer stack containing, in any order, films of GaAsP/InGaP.

The interlayer 104 and the buffer layer 106 may be deposited by any suitable deposition method, such as a metal-oxide chemical vapor deposition (MOCVD), hydride vapor phase epitaxial (HVPE), physical vapor deposition (PVD), chemical vapor deposition (CVD), and/or atomic layer deposition (ALD) processes. In one embodiment, MOCVD is used to grow the interlayer 104 and the buffer layer 106 using any suitable precursor material such as Tertiary butyl phosphine (TBP), Trimethyl gallium (TMGa), Trimethyl indium (TMIn), Tertiary butyl arsine (TBAs), and Triethyl antimony (TESb), etc.

The interlayer 104 may be a single layer of group III-V material as shown, or a stack of layers of semiconductor compounds and/or semiconductor materials. For example, the interlayer 104 may include one or more layers containing group III-V materials, as discussed above. Additionally the interlayer 104 of group III-V materials may be formed in any order.

The buffer layer 106 may be formed on the interlayer 104, such that the interlayer 104 is between the substrate 102 and the buffer layer 106. In one embodiment, the buffer layer 106 may be a group IV semiconductor material. In certain embodiments, the group IV semiconductor material may comprise silicon, germanium, and/or mixtures and combinations thereof. In certain embodiments, the concentration of arsenic or indium in the interlayer 104 may be directly related to the concentration of the germanium in the buffer layer 106. In other embodiments, the concentration of arsenic or indium in the interlayer 104 may be adjusted to match the lattice size determined by the concentration of the germanium in the buffer layer 106. The buffer layer 106 may have a thickness of between about 10 nm and about 300 nm, for example between about 20 nm and about 200 nm. As such, the combined thickness of the interlayer 104 and the buffer layer 106 may be less than about 600 nm. In certain embodiments the buffer layer 106 may be substantially parallel to the interlayer 104. In certain embodiments, the germanium is present in the buffer layer 106 in a concentration of between about 25 atomic percent and about 75 atomic percent, for example between about 30 atomic percent and about 70 atomic percent.

The structure of the film stack 100, and specifically the structure of the interlayer 104, may enable thin silicon-germanium relaxed buffer layers to be formed thereon. As noted above, the ratios of the elements within the group III-V interlayer 104 may determine the lattice size of the group III-V interlayer 104. In one embodiment, for example, the ratio of As:P may be adjusted to determine the lattice size of the group III-V interlayer 104. In another embodiment, for example, the ratio of In:Ga may be adjusted to determine the lattice size of the group III-V interlayer. The ratio of the elements within the group III-V interlayer 104 may be adjusted to match the lattice size of the buffer layer 106, such as the SiGe material of the buffer layer 106. Adjusting the composition of the interlayer 104 to match the lattice size of the semiconductor material of the buffer layer 106 may allow for a relaxed buffer layer 106.

The As:P ratio or the In:Ga ratio may each be graded from a GaP composition, for example an As:P ratio near zero (near lattice matched to silicon) to achieve the lattice size at the interlayer 104 of the adjacent buffer layer 106. Compositional grading may be utilized to achieve matching lattice sizes at the surface of the interlayer 104 as compared to the adjacent buffer layer 106. Smaller lattice sizes may be achieved at the interface with the silicon substrate 102. A grading is typically selected that achieves the quickest relaxation of the interlayer 104 film for the thinnest possible thickness, while controlling defects such as stacking faults, dislocations, and anti-phase boundaries in the interlayer 104. Such defects may affect the lattice matched relaxed buffer layer 106.

FIG. 2 schematically illustrates a processing platform 200 for processing a semiconductor substrate 102 therein. The processing platform 200 may include a transfer chamber 206, a first processing chamber 208, and a second processing chamber 210. Although only two processing chambers 208, 210 are shown it is contemplated that any number of processing chambers may be clustered and/or operatively connected to the processing platform 200. The transfer chamber 206 may include a transfer robot 204 for transferring the substrate 102 between the first processing chamber 208 and the second processing chamber 210 via the transfer chamber 206. The first processing chamber 208 and the second processing chamber 210 may each be coupled to the transfer chamber 206. Separate processing chambers 208, 210 may minimize the interlayer 104 contamination in the buffer layer 106.

The first processing chamber 208 may deposit, or grow, the interlayer 104 on the surface of the semiconducting substrate 102. The first processing chamber 208 may be a group III-V epitaxy chamber for depositing a group III-V material on the semiconducting substrate 102. In one embodiment, the first processing chamber 208 may be a III-V MOCVD epitaxy chamber. Subsequently, the transfer robot 204 may transfer the substrate 102 from the first processing chamber 208 to the second processing chamber 210 via the transfer chamber 206, thus allowing for the substrate 102 to remain under vacuum.

The second processing chamber 210 may deposit, or grow, the buffer layer 106 on the interlayer 104. The second processing chamber 210 may be a group IV epitaxy chamber for depositing a group IV material on the semiconducting substrate 102. In one embodiment, the second processing chamber 210 may be a CVD epitaxy chamber. In one embodiment, the second processing chamber 210 may deposit, or grow, the buffer layer 106 comprising a relaxed SiGe material therein without breaking vacuum. The buffer layer 106 comprising the relaxed SiGe material may be deposited on the interlayer 104 immediately after the interlayer 104 is deposited on the surface of the semiconducting substrate 102. In certain embodiments, the interlayer 104 and the buffer layer 106 may be formed at a process temperature of less than about 650 degrees Celsius.

The processing platform 200 may include a source 212 of a gallium precursor, a phosphorus precursor, and one of an indium precursor and an arsenic precursor coupled to the first processing chamber 208. The processing platform 200 may further include a source 214 of a silicon precursor and a germanium precursor coupled to the second processing chamber 210.

In one embodiment, the processing platform 200 may optionally include a pre-clean chamber 220 (shown in phantom). The pre-clean chamber 220 may be coupled to the transfer chamber 206, such that the processing platform 200 includes a cluster of processing chambers 208, 210 and the pre-clean chamber 220 surrounding the transfer chamber 206. The pre-clean chamber 220 may, in some embodiments, be a remote plasma chamber.

After deposition of the interlayer 104 a native oxide material may form on the surface of the interlayer 104. The surface of the interlayer 104 may be exposed to oxygen during and/or after the deposition of the interlayer 104, thus allowing the native oxide material to form. As such, the surface of the interlayer 104 may need cleaning to remove the native oxide formed thereon prior to deposition of the buffer layer 106. The surface of the interlayer 104 may be cleaned by the pre-clean chamber 220 prior to transferring the substrate 102 to the second processing chamber 210.

Figure 3:
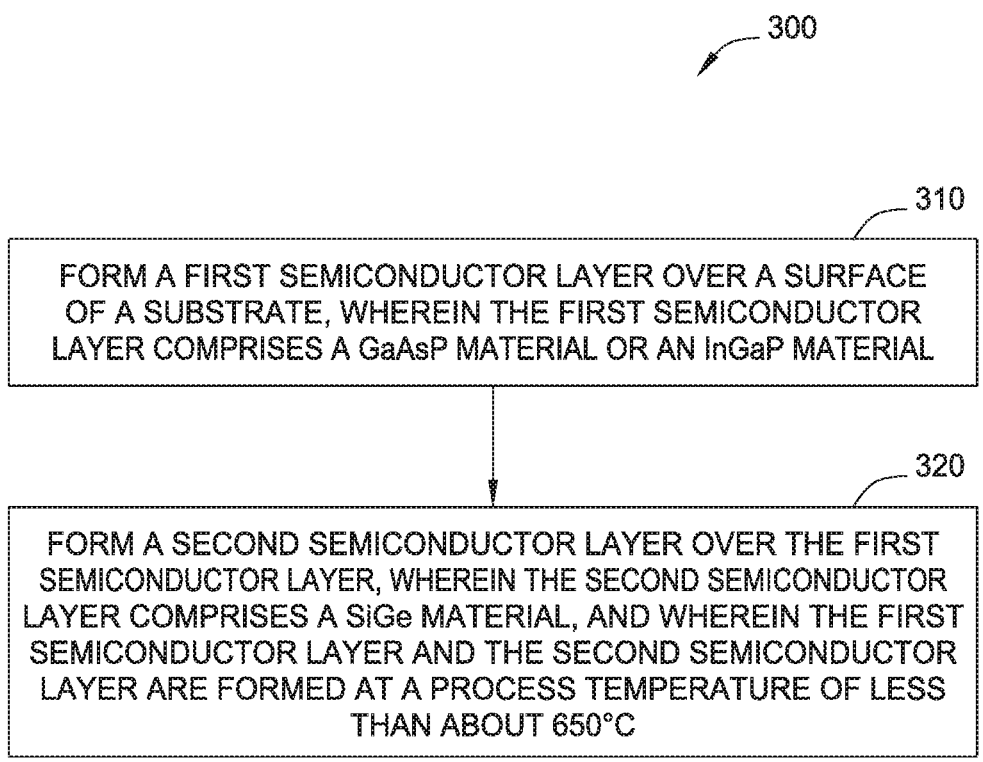
FIG. 3 schematically illustrates operations of a method for forming a semiconductor device, according to one embodiment described herein.

FIG. 3 illustrates operations of a method 300 for forming a semiconductor device according to one embodiment described herein. At operation 310 the method includes forming a first semiconductor layer over a surface of a substrate. In one embodiment, the first semiconductor layer may include a GaAsP material. In another embodiment, the first semiconductor layer may include an InGaP material. At operation 320 a second semiconductor layer is formed over the first semiconductor layer. The second semiconductor layer may include a SiGe material. The first semiconductor layer and the second semiconductor material may be formed at a process temperature of less than about 650 degrees Celsius.

Using the methods and apparatus described herein, relaxation can be achieved at the interlayer, below the buffer layer, such that the buffer layer material may be matched at its relaxed lattice size. Matching the buffer layer material may minimize the formation of defects in the buffer layer material except at locations on or within the interlayer surface that may be propagated during buffer layer growth. Further benefits may include faster relaxation within the interlayer as well as smoother films. Laboratory testing has shown that, for example, as grown GaAs is less than 10 angstroms rms for 400 nm thicknesses. On the other hand, traditionally grown graded SiGe strain relaxed buffers are greater than 100 angstroms rms and usually need a chemical-mechanical polishing (CMP) process.

Additional benefits of the present disclosure include increased success rates for achieving a total stack thickness on the order of about 500 nm and/or less than about 500 nm, as compared to traditionally formed SiGe buffers which usually result in a thickness of about 1-3 micrometers for the same defect density. Further benefits may include that APBs may not form on group IV films placed over group III-V layers. Therefore, the propagation of defects at the interlayer, for example the III-V surface, onto the buffer layer, for example the SiGe material, may be less than the defect formation during SiGe relaxation when grown directly on the silicon. Additional benefits of the present disclosure may include allowing for a percent germanium up to 70% in the buffer layer comprising SiGe. Thus, the present disclosure is extendable from early 30% germanium SiGe silicon relaxed buffers for 50% SiGe strained channels to 70% germanium SiGe buffer layers for pure germanium strained channels. Furthermore, the interlayer, for example comprising the group III-V material, may be of a high bandgap. Therefore, defects therein, such as APBs and dislocations, may be less detrimental to overall device performance.

While the foregoing is directed to embodiments of the disclosure, other and further embodiments of the disclosure may be devised without departing from the basic scope thereof, and the scope thereof is determined by the claims that follow.

The invention claimed is:

1. A semiconductor device, comprising:
a semiconductor substrate having a first surface;
a group III-V interlayer formed on and in contact with the first surface, wherein the group III-V interlayer comprises a $GaAs_xP_y$ material; and
a group IV buffer layer comprising silicon and germanium formed on and in contact with the group III-V interlayer, wherein the concentration of arsenic in the group III-V interlayer is directly related to the concentration of germanium in the group IV buffer layer, and wherein x and y are selected to provide a lattice mismatch of less than about 5% between the group III-V interlayer and the group IV buffer layer.

2. The semiconductor device of claim 1, wherein the germanium is present in the group IV buffer layer in a concentration of between about 30 atomic percent and about 70 atomic percent.

3. The semiconductor device of claim 1, wherein the concentration of arsenic in the group III-V interlayer is graded, and wherein the concentration of arsenic is greater near the group IV buffer layer.

4. The semiconductor device of claim 1, wherein the group III-V interlayer has a thickness of between about 2 nm and about 400 nm.

5. The semiconductor device of claim 1, wherein the group IV buffer layer has a thickness of between about 20 nm and about 200 nm.

6. The semiconductor device of claim 1, wherein the combined thickness of the group III-V interlayer and the group IV buffer layer is less than about 600 nm.

7. The semiconductor device of claim 1, wherein the group IV buffer layer is substantially parallel to the interlayer.

8. The semiconductor device of claim 1, wherein a lattice size of the group IV buffer layer substantially matches the lattice size of the group III-V interlayer.

9. The semiconductor device of claim 1, wherein the group III-V interlayer and the group IV buffer layer are formed at a process temperature of less than about 650° C.

10. A method for forming a semiconductor device, comprising:
forming a first semiconductor layer on and in contact with a surface of a substrate, wherein the first semiconductor layer comprises a $GaAs_xP_y$ material; and
forming a second semiconductor layer on and in contact with the first semiconductor layer, wherein the second semiconductor layer comprises a SiGe material, and wherein the first semiconductor layer and the second semiconductor layer are formed at a process temperature of less than about 650° C., and wherein x and y are selected to provide a lattice mismatch of less than about 5% between the first semiconductor layer and the second semiconductor layer.

11. The method of claim 10, wherein the germanium is present in the second semiconductor layer in a concentration of between about 30 atomic percent and about 70 atomic percent.

12. The method of claim 10, wherein a concentration of arsenic in the first semiconductor layer is directly related to the concentration of germanium in the second semiconductor layer.

13. The method of claim 10, wherein a combined thickness of the first semiconductor layer and the second semiconductor layer is less than about 600 nm.

14. The method of claim 13, wherein the first semiconductor layer has a thickness of between about 2 nm and about 400 nm.

* * * * *